(12) United States Patent
Zheng

(10) Patent No.: US 7,261,572 B2
(45) Date of Patent: Aug. 28, 2007

(54) SELF-BALANCED LAND GRID ARRAY SOCKET

(75) Inventor: Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/978,007

(22) Filed: Oct. 29, 2004

(65) Prior Publication Data

US 2006/0094265 A1 May 4, 2006

(51) Int. Cl.
*H01R 12/00* (2006.01)
(52) U.S. Cl. .......................................... 439/70
(58) Field of Classification Search .................. 439/70, 439/692; 324/762, 761, 757
See application file for complete search history.

(56) References Cited

U.S. PATENT DOCUMENTS

| | | | |
|---|---|---|---|
| 5,945,736 A * | 8/1999 | Rife et al. ................. | 257/719 |
| 6,752,635 B1 * | 6/2004 | Searls et al. ................. | 439/71 |
| 6,755,668 B2 * | 6/2004 | Copper et al. ............... | 439/83 |
| 2004/0077202 A1 * | 4/2004 | Copper et al. .............. | 439/241 |

OTHER PUBLICATIONS

Disclosed Anonymously, Reduced stress pad pattern for ball grid array packages, Research Disclosure Journal, Kenneth Mason Publications Ltd. Sep. 1993, [online]. Research Disclosure, Database No. 353055; Journal No. 35355.*

Disclosed Anonymously, An alternative pin layout to reduce CTE anisotropy and mismatch with FR-4, Research Disclosure Journal, Kenneth Mason Publications Ltd. Jan. 2000, [online]. Research Disclosure, Database No. 429033.*

Lee Hymes, Circuits Assembly, San Francisco: Aug. 2003. vol. 14 Issue 8 p. 31. Retrieved [online] from: ProQuest, document ID 384594411.*

Eric W. Weisstein, Eric Weisstein's World of Physics, 1996-2006, www.scienceworld.wolfram.com/physics/mechanics/forces.*

* cited by examiner

*Primary Examiner*—Tho D. Ta
*Assistant Examiner*—Vanessa Girardi
(74) *Attorney, Agent, or Firm*—Blakely, Sokoloff, Taylor & Zafman LLP

(57) ABSTRACT

According to a first embodiment of the invention, a Land Grid Array (LGA) socket includes two sets of spring-loaded contacts, the contacts in the first set having an orientation opposite the contacts in the second set. Each set of contacts is positioned such that the total force and total moment of about the socket center by the wiping of the contacts is near zero. According to a second through fourth embodiment of the invention, a rectangular socket may be formed. According to these embodiments, the contacts are divided into four sets. Each set may have a different orientation, arranged so that the total force and moment are near zero.

22 Claims, 7 Drawing Sheets

SELF-BALANCED LAND GRID ARRAY SOCKET

FIELD OF THE INVENTION

The invention generally relates to semiconductor packaging, and specifically to Land Grid Array (LGA) sockets.

BACKGROUND

Semiconductor devices, such as microprocessor dies, are typically mounted in a package and attached to a printed circuit board (PCB), such as a motherboard, through a socket. The socket interfaces with connections on the package to distribute power to and signals from the package (and the semiconductor device) to other devices. Several technologies exist for making connections between the socket and the package, including pin grid array (PGA), ball grid array (BGA), and land grid array (LGA).

LGA sockets include spring-loaded contacts to interface with conductive pads on a packaged semiconductor device. The socket may be soldered onto a motherboard with BGA contacts (e.g., solder balls) under the socket. The spring-loaded contacts create pressure against the pads of the package when the package is inserted into the socket. This pressure assures reliable electric connection between the motherboard and the package. When an LGA contact is pressed the package is inserted into the socket, the tip of the contact wipes a certain distance along the landing pad surface of the package.

FIG. 1 illustrates an LGA socket. The socket 100 includes several contacts divided into two L-shaped regions 102 and 104. The two regions 102 and 104 may include contacts having different orientations (relative to a socket sidewall 106) to obtain enough deflection working range and to avoid electrical shorting. The wiping angle of contacts in each of the two regions 102 and 104 may be represented by the two arrows 108 and 110, respectively. A package is inserted into the socket 100 and the contacts in the regions 102 and 104 make contact with pads on the package to create electrical connections with the semiconductor device encased in the package.

The wiping of the contacts onto the pads creates friction that may twist an installed package. Using some designs, the resulting torque could be as high as 6 lbs-in. This may result in a misalignment of the package during assembly or damage the solder balls under the socket 100. For example, the excessive torque can weaken solder joints connecting the contacts to the socket 100. Alignment pins 112, which attach to the installed package, may be used to reduce the force generated by the contacts, or the socket housing may be constructed from thicker and stronger material. However, these additions may significantly increase the cost of the package 100.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein is a Self-Balanced Land Grid Array Socket. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to a first embodiment of the invention, a Land Grid Array (LGA) socket includes two sets of spring-loaded contacts, the contacts in the first set having an orientation opposite the contacts in the second set. Each set of contacts is positioned such that the total force and total moment about the socket center by the wiping of the contacts is near zero. According to one embodiment, the two sets of contacts are formed by arranging the contacts in a square, dividing the square along a diagonal, and assigning a first orientation to the contacts on one side of the diagonal, and a second orientation opposite the first orientation to the contacts on the opposite side of the diagonal. According to a second through fourth embodiment of the invention, a rectangular socket may be formed. According to these embodiments, the contacts are divided into four sets. Each set may have a different orientation, arranged so that the total force and moment are near zero. The result of arranging the contacts of the socket in such a way is to reduce or eliminate torque on an installed package, thereby reducing the cost of the package since alignment pins or reinforced sockets are no longer needed.

Figure 1:
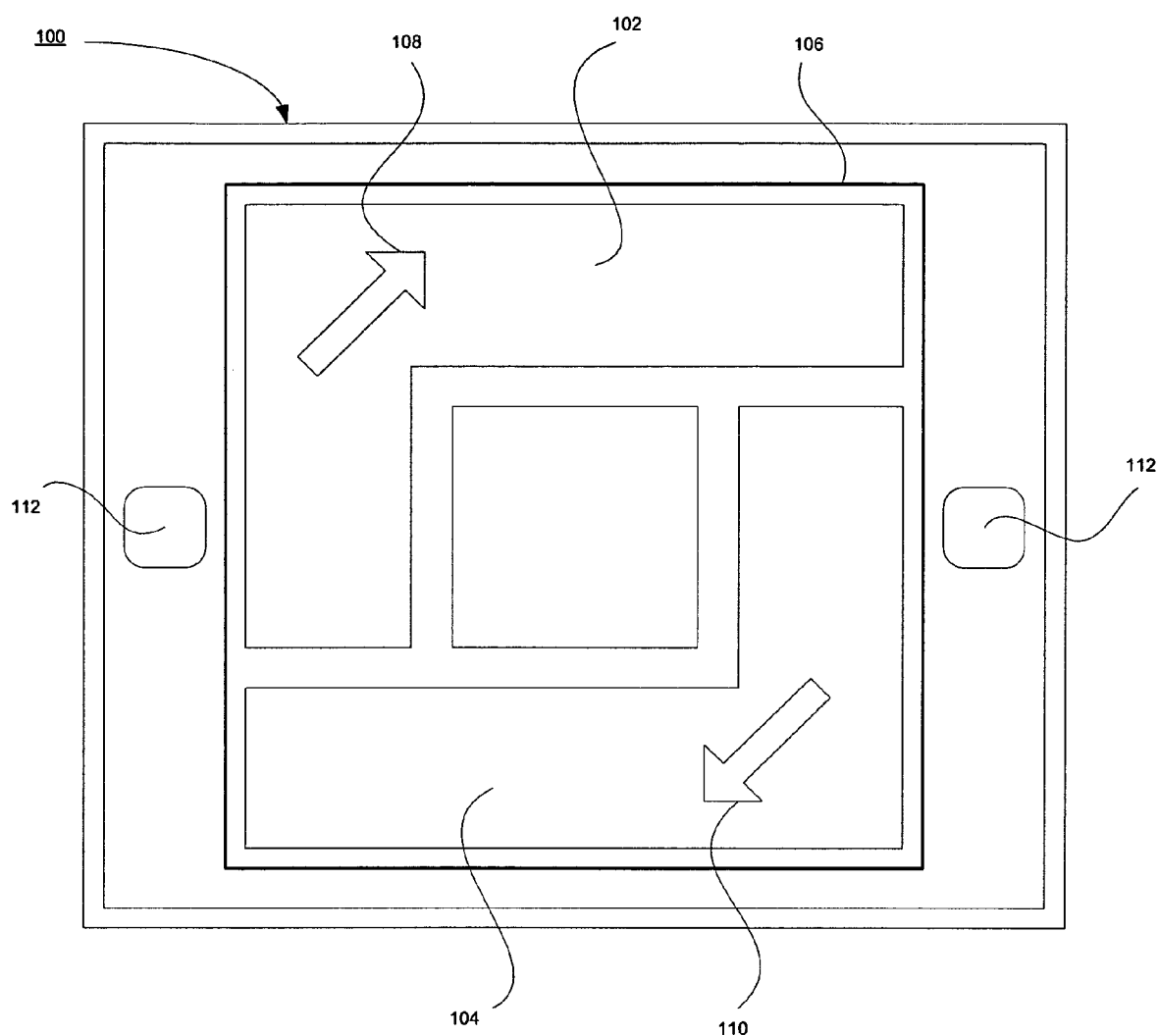
FIG. 1 illustrates an LGA socket.
Figure 2A:
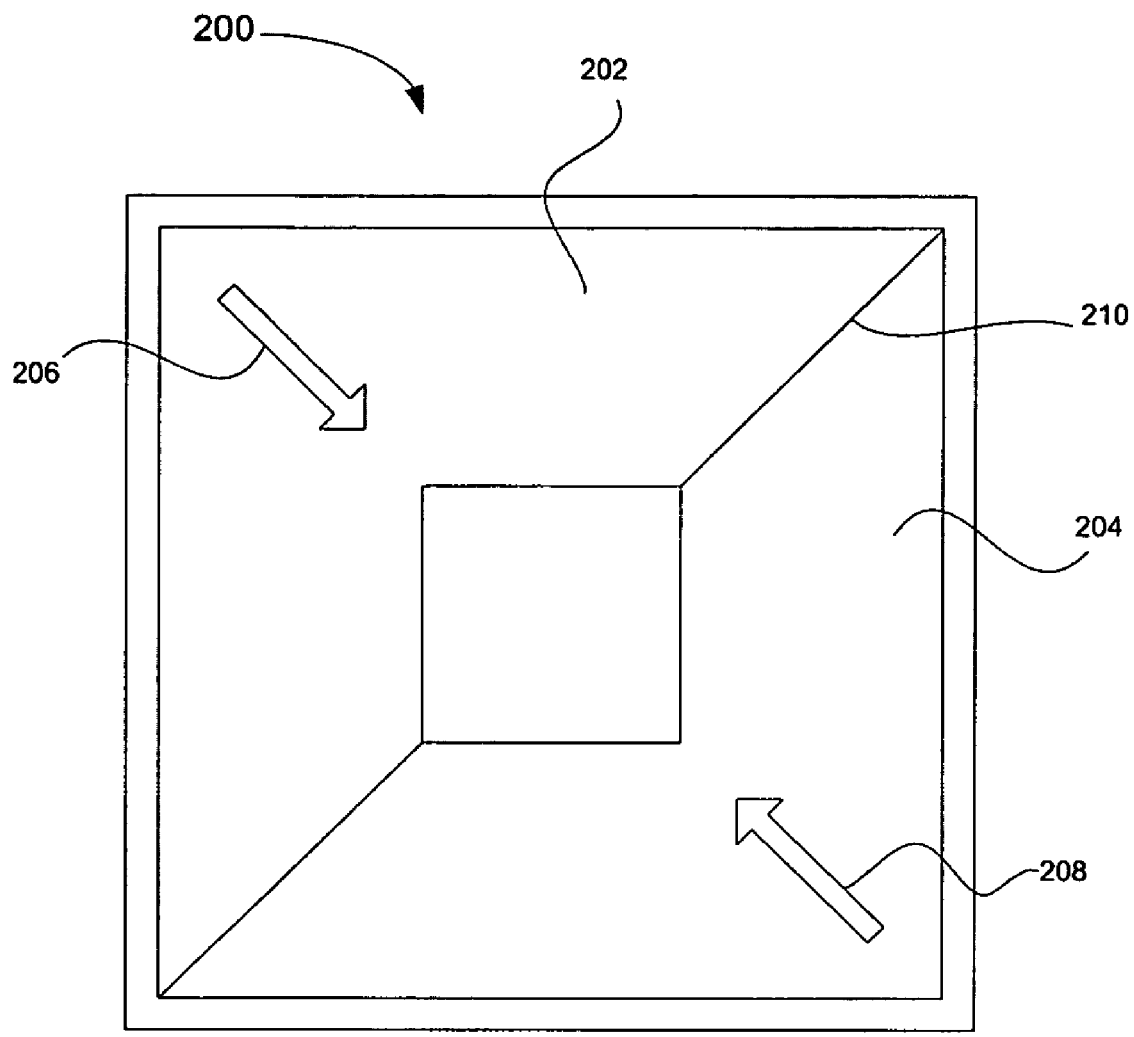
FIGS. 2A-C illustrate an LGA socket having a square shape according to a first embodiment of the invention.
Figure 2B:
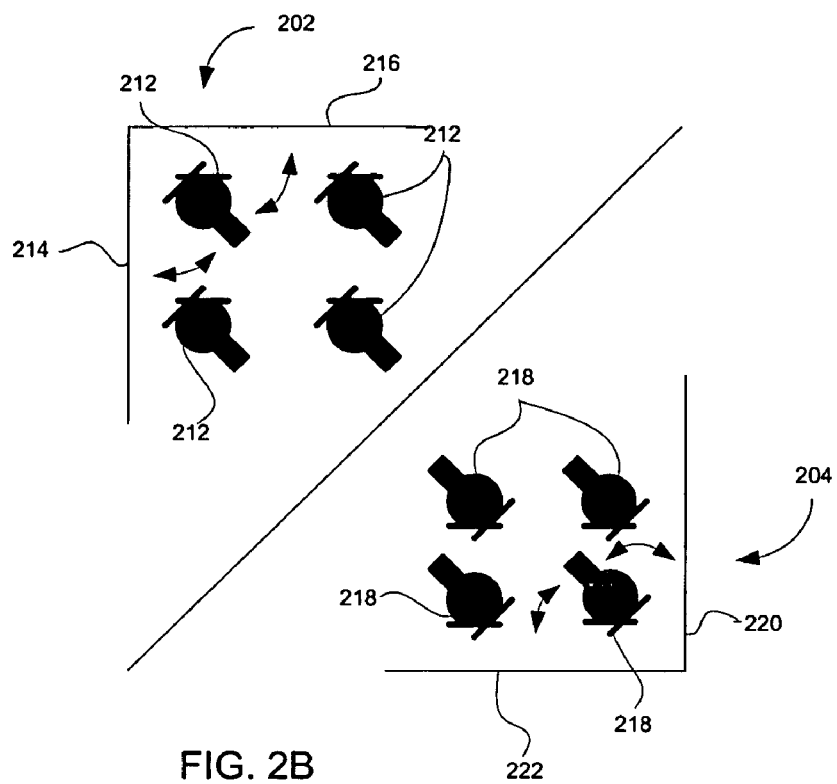
Figure 2C:
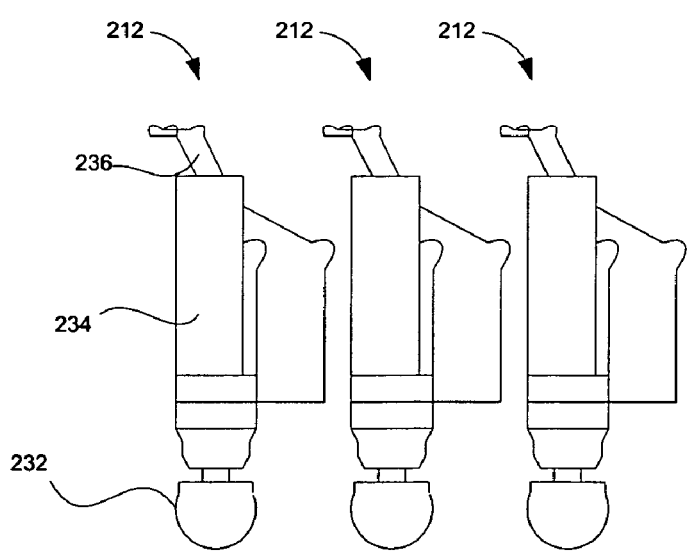

According to an embodiment of the invention, FIGS. 2A-C illustrate an LGA socket having a square shape. According to this embodiment, the LGA socket includes several contacts divided into two approximately equal sets that are arranged into two regions of approximately equal shape and size, where the two fields are divided by a diagonal of the socket. The orientations of contacts in the two fields are opposite one another. The resulting forces and moments generated by the contacts wiping against a package are approximately zero, obviating the need for reinforcing techniques previously used.

Hereinafter, when describing a force or moment about the socket center generated, the force or moment is generated by the friction force resulted from spring-loaded contacts upon an inserted package. The contacts, through wiping, generate spring pressure against the inserted package. The several embodiments of the invention described herein reduce the total in-plane force or moment acting upon the socket to approximately zero.

For example, each region may contain a contact. The contact in the first region may be oriented forty-five degrees from each side of an LGA socket 200. The two contacts will generate approximately the same amount of force through wiping action against pads on an installed package. Since the two contacts are oriented opposite each other, the forces are directed in opposite directions and cancel, resulting in a total force of approximately zero. Likewise, because of the shape of the regions, the total moment about the socket center cancels between the two fields.

An LGA socket 200 as shown in FIG. 2A includes several spring-loaded contacts divided into two sets 202 and 204. The two sets 202 and 204 are arranged into a first shape and a second shape, respectively. As shown here, the first and second shapes are triangular and defined by a diagonal across the socket 200.

The contacts in each of the sets 202 and 204 has an orientation opposite the contacts in the other set. For example, the contacts in the set 202 may be oriented along the arrow 206, and the contacts in the set 204 may be oriented along the arrow 208. The two sets 202 and 204 are divided by the diagonal 210. Using this configuration, the contacts in the set 202 create a first force and a first moment about the socket center that is cancelled by the second force and the second moment about the socket center generated by the contacts in the set 204. As a result, the total force and total moment of the contacts comprising the socket 200 is approximately zero, resulting in little or no shear and torque on a package inserted into the socket 200. The retaining pins or reinforced sockets required by previous solutions are thereby obviated.

The force generated by the first set 202 is opposite the orientation 206 of the contacts of the first set 202 (i.e., the force is directed away from the center of the socket 200). Likewise, the force generated by the second set 204 is opposite the orientation 208 of the contacts of the second set 204. According to another embodiment, the orientations 206 and 208 may be reversed. In this case, the contacts would be oriented away from the center of the socket 200, and the force generated by the contacts would be directed toward the center of the socket 200.

It is understood that the socket 200 shown in FIG. 2A may be fully populated, or may (as shown) be de-populated in the center. Further, it is understood that the landing pads on the package to be inserted may need to be designed in compliance with the specific orientations of each set of contacts 202 and 204. For example, the pads may need to be oriented toward the contacts. Such modifications are well-known in the art.

FIG. 2B illustrates individual contacts in each of the two sets of contacts 202 and 204. The contacts 212 in the set 202 are, according to one embodiment of the invention, oriented approximately 45° from each of the walls 216 and 214 bounding the socket 200. Likewise, the contacts 218 of the set 204 are oriented approximately 45° from each of the walls 220 and 222 of the socket 200. The contacts 212 and 218 may be any one of several well-known LGA contacts.

For each contact 212 in the first set 202, there is another contact 218 in the second set 204 that is located relative to the center of the socket 200 so that the two contacts create a force and a moment that cancel each other out. If a rectangular (rather than square) shaped package and socket are to be used, another configuration described regarding the second through fourth embodiments of the invention, may be used to reduce torquing of the package.

FIG. 2C illustrates individual contacts 212 according to an embodiment of the invention. The contacts 218 are similar to the contacts 212. The contact 212 includes a solder ball 232 (e.g., a Ball Grid Array (BGA) ball), a supporting member 234, and a cantilever beam 236. The cantilever beam 236 acts as a spring and provides the wiping action against the landing pads on the package. It is understood that other types of contacts may be used in accordance with embodiments of the invention.

FIGS. 3A-E illustrate three embodiments of rectangular-shaped LGA sockets. According to each of the three embodiments, a socket 300 is divided into four equal regions. The regions are delimited by two lines bisecting each of the walls of the socket 300. Each region includes a different set of contacts that may have different characteristics regarding orientation relative to the other sets of contacts.

Figure 3A:
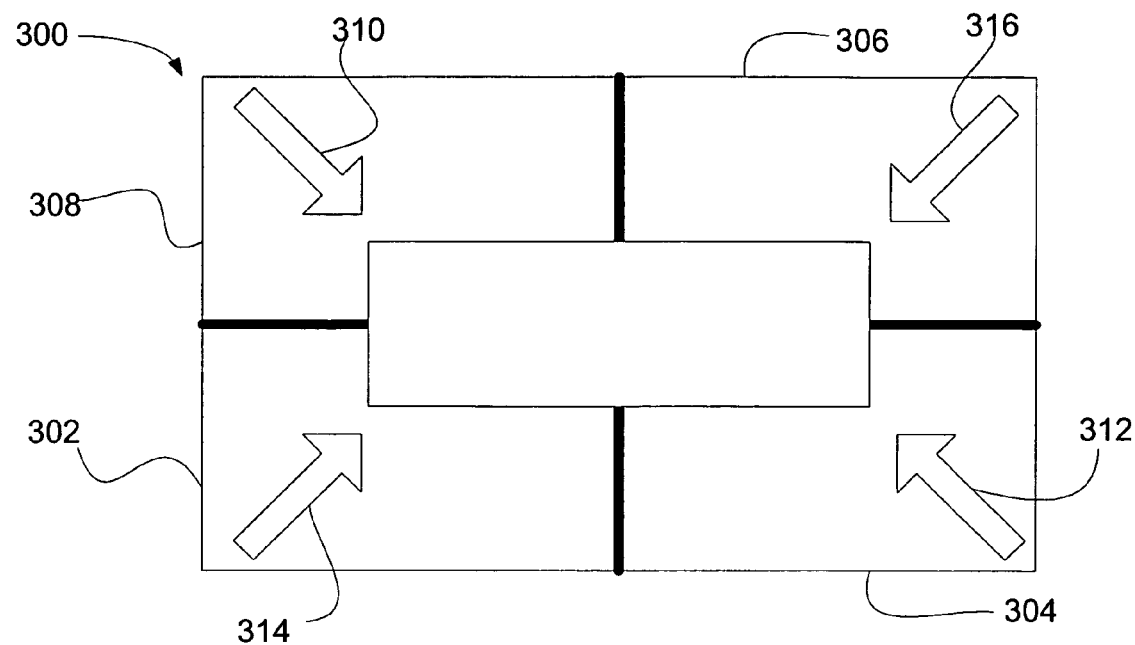
FIGS. 3A-E illustrate three embodiments of rectangular-shaped LGA sockets.
Figure 3B:
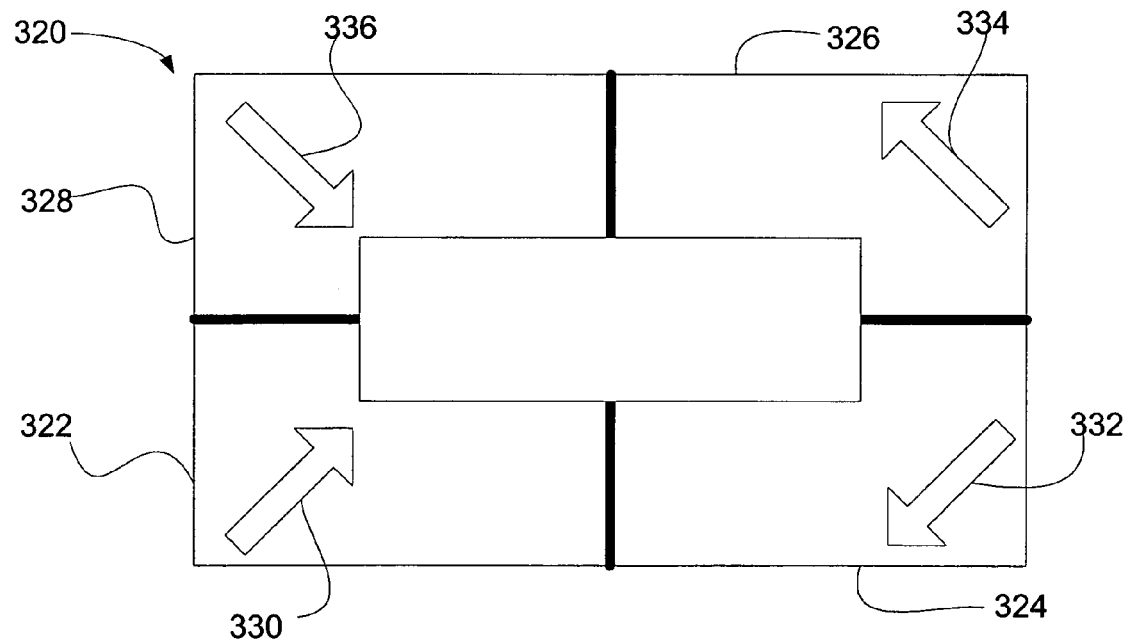
Figure 3C:
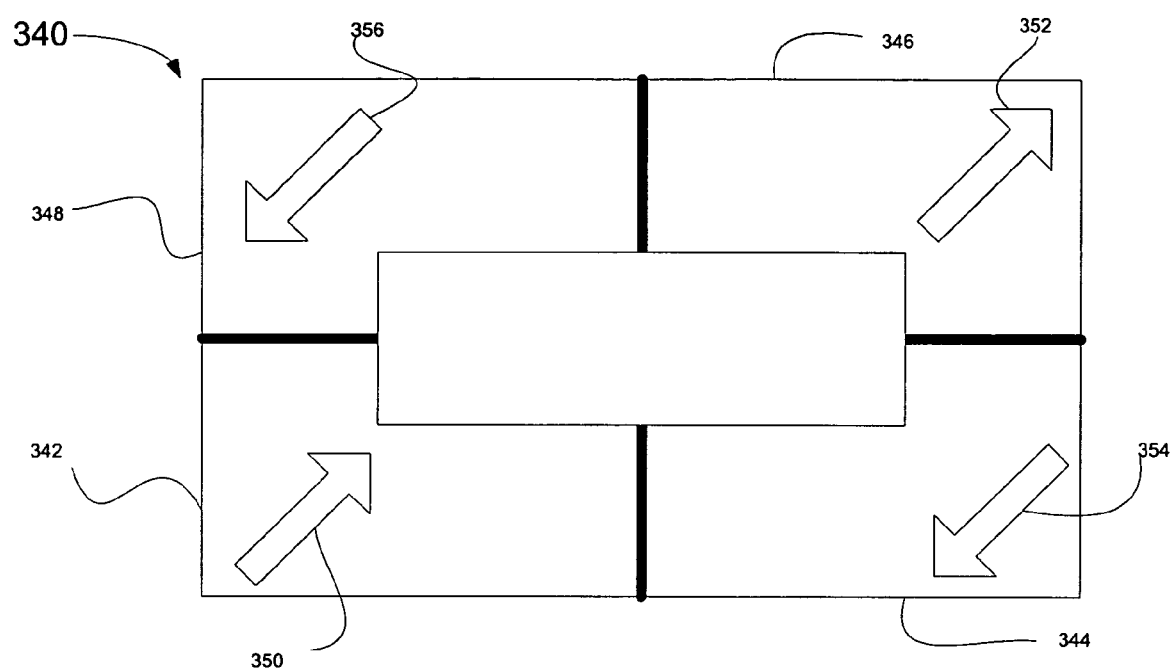

Although the sockets 300, 320, and 340 as shown in FIGS. 3A-3C are de-populated in the center, it is understood that the sockets 300, 320, and 340 may also be fully populated. Further, the several orientations of the contacts described below are arbitrary. Any appropriate orientation may be chose according to the conditions described below. Any one of the three embodiments described in FIGS. 3A-C may be chosen when a rectangular LGA socket is used depending on the requirements of the particular socket. However, as will be explained below, according to one embodiment of the invention, the socket 340 shown in FIG. 3C may require less assembly than the other sockets shown.

FIG. 3A illustrates a second embodiment of the invention. According to this embodiment, the socket 300 is divided into four sets of contacts 302, 304, 306, and 308. The first 302 and third 306 sets have opposite orientations 310 and 312, respectively, resulting in a total force of approximately zero between the first 302 and third 306 sets of contacts. Likewise, the second 304 and fourth 308 sets have orientations 314 and 316, respectively, that result in a total force of approximately zero between the second 304 and fourth 308 sets of contacts. As mentioned above, the forces generated by each region are in the opposite direction of the orientations 310, 312, 314, and 316.

Each of the sets 302, 304, 306, and 308 generates a force. However, the force generated by the first set 302 is approximately equal and opposite the force generated by the third set 304, and the forces cancel. Likewise, the force generated by the second set 304 is approximately equal and opposite the force generated by the fourth set 308, and the forces cancel. Since the orientations 310 and 312 are not collinear, there is a moment generated between the first 302 and third 306 sets of contacts. The moment is normal to the socket 320. However, an equal and opposite moment is generated between the second 304 and fourth 308 sets of contacts, resulting in a total moment of approximately zero.

FIG. 3B illustrates a third embodiment of the invention. According to this embodiment, a socket 320 is again divided into four sets of contacts 322, 324, 326, and 328. The sets are delimited by two lines bisecting each of the walls of the socket 320. The total forces and moments generated by the four sets of contacts 322, 324, 326, and 328 is approximately zero.

The individual contacts in the first set of contacts 322 and the second set of contacts 324 have orientations following arrows 330 and 332, respectively. As a result, the force generated by the contacts in the first set 322 is equal and opposite the force generated by the second set of contacts 324, and the forces cancel. Likewise, the individual contacts in the third set of contacts 326 and the fourth set of contacts 328 have orientations following arrows 334 and 336, respectively. The force generated by the third set of contacts 326 is equal and opposite the force generated by the fourth set of contacts 328, and the forces cancel.

Since the orientations 330 and 332 are not collinear, there is a moment between the first and second sets 322 and 324. Further, since the orientations 334 and 336 are not collinear, there is another moment between the third and fourth sets 326 and 328. These moments are normal to the socket 320, and are equal and opposite, and canceling each other. This results in a net torque of approximately zero on the socket 320 and the installed package.

FIG. 3C illustrates a fourth embodiment of the invention. According to the fourth embodiment of the invention, a socket 340 includes four sets of contacts 342, 344, 346, and 348, arranged similarly to those described above. The first and third sets 342 and 346 have approximately the same number of contacts and are oriented along the arrows 350 and 352, respectively. Since the contacts in the sets 342 and 346 have the same orientations, the moment between the sets 342 and 346 is approximately zero. Since the forces generated by each of the sets 342 and 346 are not opposite, the forces are additive and do not cancel. Likewise, the contacts in the second and fourth sets 342 and 346 have approximately the same number of contacts and are oriented along the arrows 354 and 356, respectively. The orientation of the two sets 342 and 346 is in the same direction, so there is no moment between the second and fourth sets 342 and 346. However, a result force is generated, since the orientations of the second 342 and fourth 346 sets are not opposite. The orientations 350 and 352 are the same, and opposite the orientations 354 and 356. The total force for the socket 340 cancels, as is explained in the discussion regarding FIGS. 3D and 3E.

Figure 3D:
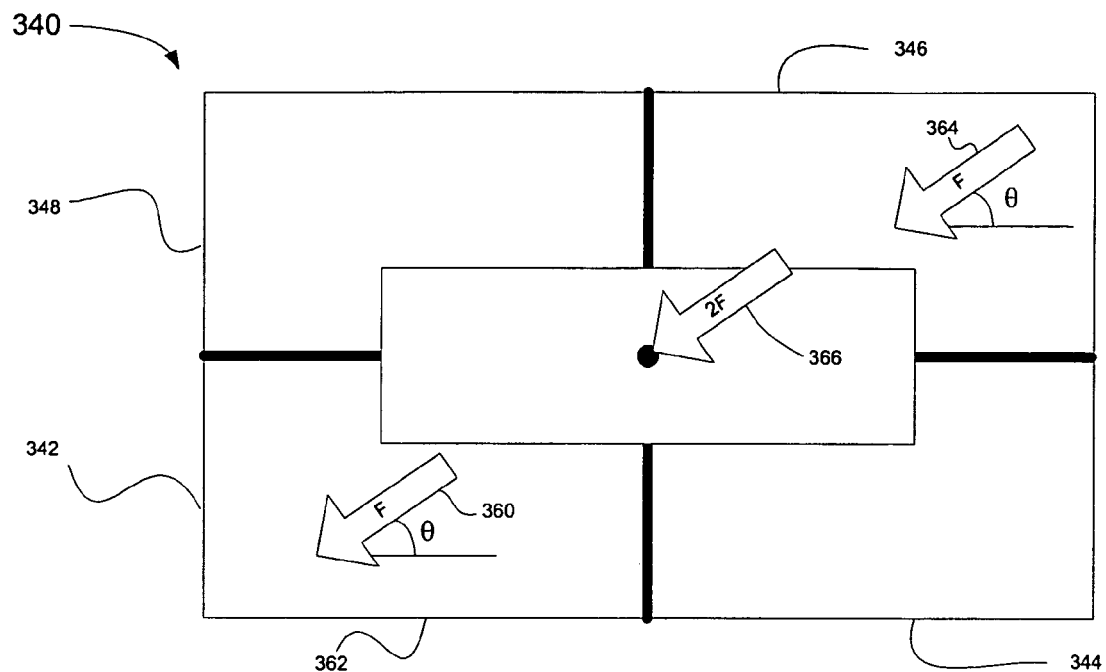
Figure 3E:
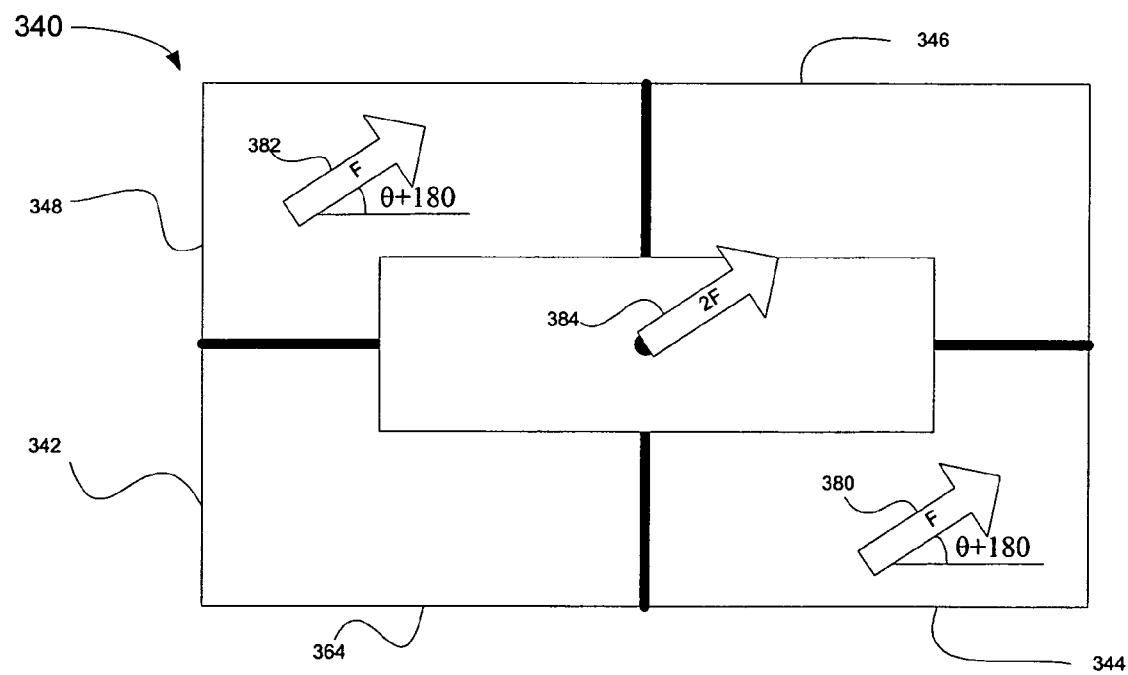

FIGS. 3D and 3E illustrate the forces generated by the four sets of contacts 342-348 of the socket 340. As can be seen in FIG. 3D, a force 360 is generated by the first set of contacts 342 at an angle $\theta$ relative to the bottom side 362 of the socket 340. A force 364 is generated by the third set of contacts 346 at approximately the same angle $\theta$ since the contacts in the first set 342 have the same orientation as the contacts in the third set 346. Each of the forces 360 and 364 has a magnitude of approximately F, since there are approximately the same number of contacts in each of the sets 342 and 346. The forces 360 and 364 add to generate a total force 366 having a magnitude of 2 F acting at the angle $\theta$ at the center of the socket 340.

FIG. 3E illustrates the forces generated by the sets of contacts 344 and 348. The second set 344 generates a force 380 having a magnitude F at an angle $\theta+180°$. The fourth set 348 generates a force 382 having a magnitude F at the angle $\theta+180°$, since the contacts in the second 344 and fourth 348 sets are oriented in the same direction, and since there are approximately the same number of contacts in the sets 344 and 348. The forces 380 and 382 add to generate a total force 384 having a magnitude 2 F acting at the angle $\theta+180°$ at the center of the socket 340.

The two forces 366 and 384 have approximately equal magnitude (2 F), and act at the same location (the center of the socket 340) in opposite directions. Therefore, the forces 366 and 384 approximately cancel each other, giving a resultant force for the socket of approximately zero. As mentioned above, since the contacts in the first set 342 are collinear to the contacts in the third set 346, and the contacts in the second set 344 are collinear to the contacts in the fourth set 348, no moment is generated.

According to one embodiment of the invention, since the contacts in the first and third sets 342 and 346 are collinear, the first and third sets of contacts 342 and 346 can be assembled at the same time, since all of the contacts have the same orientations. Likewise, the second and fourth sets of contacts 344 and 348 may also be assembled together. The socket 340 may be assembled in two operations, rather than in four operations as would be required for the other sockets having four different orientations.

The sockets 200, 300, 320, and 340 may be mounted on a printed circuit board (PCB), such as a motherboard, to interact with an inserted semiconductor package. The PCB may be part of a larger computer system, and may include other sockets or other components, such as memory sockets, hardwired semiconductor devices (such as memories including Random Access Memory (RAM) or Read Only Memory (ROM)), and Input/Output (I/O) devices. According to one embodiment, the sockets 200, 300, 320, and 340 may accept a microprocessor such as a Central Processing Unit (CPU).

Figure 4:
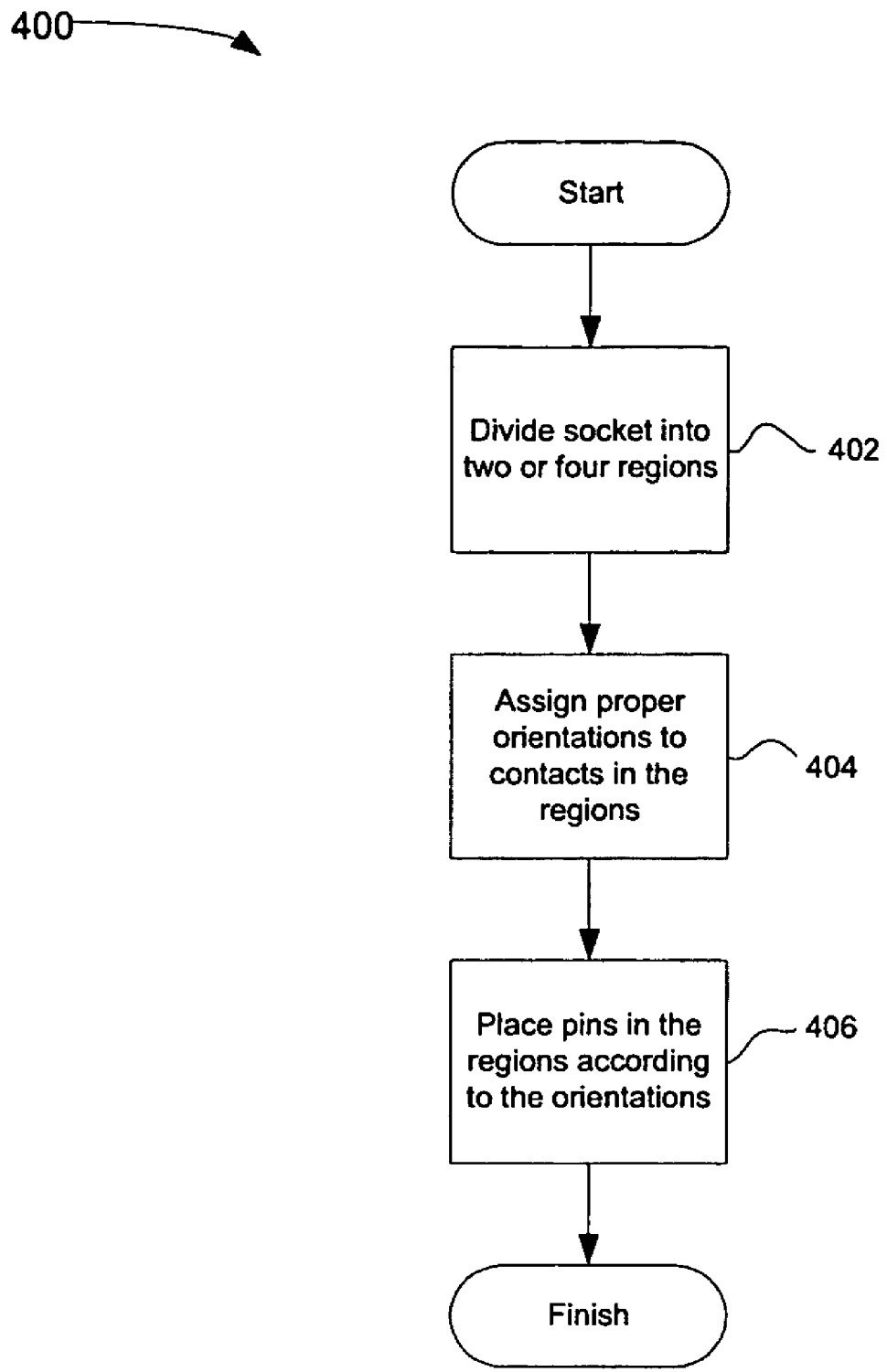
FIG. 4 is a flowchart describing a process for assembling an LGA socket according to an embodiment of the invention.

FIG. 4 is a flowchart describing a process for assembling an LGA socket according to an embodiment of the invention. In block 402, the socket is divided into either two or four equal regions. If the socket is square, the socket may be divided into two regions delimited by a diagonal of the socket. If the socket is rectangular, the socket may be divided into four regions delimited by two lines bisecting the walls of the socket (as can be seen in FIGS. 3A-C).

In block 404, the contacts in each region is assigned a specific orientation. For example, if a square LGA socket is used, the socket is divided into two regions, and the contacts in each region are oriented 45° from the walls of the socket. The contacts in each region are also oriented opposite the contacts of the other region. The orientations for rectangular sockets are described above. For example, using the configuration shown in FIG. 3C, the orientations of the first and third sets 342 and 346 are the same, while the orientations of the second 344 and fourth 348 sets are the same. When using a rectangular socket, according to an embodiment of the invention, the specific orientation chosen is arbitrary, so long as the relationships of the orientations between the regions are proper.

In block 406, sets of contacts are placed in each region according to the orientations determined in block 404. Since the contacts are oriented such that an inserted package has approximately zero force and zero moment acting upon it, additional reinforcement of the package is unnecessary.

This invention has been described with reference to specific exemplary embodiments thereof. It will, however, be evident to persons having the benefit of this disclosure that various modifications changes may be made to these embodiments without departing from the broader spirit and scope of the invention. The specification and drawings are accordingly to be regarded in an illustrative rather than in a restrictive sense.

What is claimed is:

1. A land grid array (LGA) socket comprising:
    a rectanaular-shape having a center;
    a distribution of spring loaded contacts to electrically and mechanically engage a package inserted into the socket, wherein the socket is divided into four distinct regions,
wherein each of the four distinct regions is populated by a distinct set of contacts, wherein the distinction of each set of contacts to the other three contacts is derived from contact orientation with respect to the center of the socket, wherein each set of contacts contributes a force upon the package which is;
    unique from the other three regions, in magnitude and/or direction, wherein the shape of each region and contact orientation relative to the socket determine the magnitude and direction of the force contributed by each of the regions on the inserted package,
    wherein the combination of forces and moments about the center of the socket of any two of the four regions, results in either the sum of the forces on the inserted package due to two of the four regions to be substantially greater than zero, or the sum of the moments on the inserted package, about the center of the socket, due to two of the four regions, to be substantially greater than zero, and wherein the combination of forces and moments about the center of the socket of the combination of the four regions results in both the sum of the forces on the inserted package to be approximately zero and the sum of the moments on the inserted package, about the center of the socket, to also be approximately zero.

2. The socket of claim 1, wherein the spring loaded contacts have approximately a forty-five degree wiping angle.

3. The socket of claim 1, wherein the socket further comprises a central region devoid of contacts.

4. The socket of claim 3, wherein the central region devoid of contacts is symmetric about the center of the socket.

5. The socket of claim 1, wherein the shapes of the contacts in each region are similar.

6. The socket of claim 1, wherein the orientations of the contacts of one region, selected from the plurality of regions, and the orientations of the contacts of another region, selected from the plurality of regions, have orientations that are approximately opposite each other, wherein the combination of tangential forces produced by both regions, when a package is inserted into the socket, is approximately zero, and wherein the torque produced by the combination of moments about the center of the socket, when a package is inserted into the socket, by both regions is substantially regions is substantially greater than zero.

7. The socket of claim 1, further comprising:
a printed circuit board (PCB) coupled to the socket; and
a memory coupled to the PCB.

8. The socket of claim 7, wherein the socket accepts a central processing unit (CPU).

9. The socket of claim 1, wherein pads on a semiconductor package to be inserted into the socket are oriented relative to the orientations of the contacts in each region.

10. The socket of claim 1, wherein the four distinct regions of contacts further comprises:
a first region of contacts having a first shape and a first orientation;
a second region of contacts adjacent the first region of contacts, the second region of contacts having a second shape and a second orientation;
a third region of contacts opposite the first region of contacts, the third region of contacts having a third shape and a third orientation opposite the first orientation; and
a fourth region of contacts opposite the second region of contacts, the fourth region of contacts having a fourth shape and a fourth orientation opposite the second orientation;
wherein a first moment about the socket center, resulting from the first region and the third region of contacts when a package is inserted into the socket, is cancelled by a second moment about the socket center, resulting from the second region of contacts and the fourth region of contacts when a package is inserted into the socket.

11. The socket of claim 10, wherein the first, second, third, and fourth shapes are similar.

12. The socket of claim 10, wherein the first, second, third, and fourth regions of contacts are delimited by a first line bisecting the socket lengthwise and a second line bisecting the socket widthwise.

13. The socket of claim 1, wherein the four distinct regions of contacts further comprises:
a first region of contacts having a first shape and a first orientation;
a second region of contacts adjacent the first region of contacts, the second region of contacts having a second shape and a second orientation opposite the first orientation;
a third region of contacts adjacent the second region of contacts, the third region of contacts having a third shape and a third orientation; and
a fourth region of contacts opposite the second region of contacts, the fourth region of contacts having a fourth shape and a fourth orientation opposite the third orientation;
wherein a first moment about the socket center, resulting from the first region of contacts and the second region of contacts when a package is inserted into the socket, is cancelled by a second moment about the socket center, resulting from the third region of contacts and the fourth region of contacts when a package is inserted into the socket.

14. The socket of claim 13, wherein the first, second, third, and fourth shapes are similar.

15. The socket of claim 13, wherein the first, second, third, and fourth regions of contacts are delimited by a first line bisecting the socket lengthwise and a second line bisecting the socket widthwise.

16. The socket of claim 1, wherein a pair of symmetrically located contacts relative to the center of the socket have orientations such that the pair of contacts create forces that approximately cancel each other out and a moment about the socket center that is substantially greater than zero.

17. A method comprising:
dividing a land grid array (LGA) socket having a distribution of spring loaded contacts into a plurality of distinct regions, wherein the plurality comprises at least three distinct regions;
determining a plurality of orientations for said contacts in each of the plurality of regions;
wherein each of the plurality of regions is populated by a distinct set of contacts, wherein the distinction of each set of contacts to the other regions is derived from contact orientation with respect to the center of the socket, wherein each set of contacts contributes a force upon the package, which is unique from the other regions;
wherein the combination of forces and moments about the center of the socket of any two of the plurality of regions, results in either the sum of the forces on the inserted package due to two of the plurality of regions to be substantially greater than zero, or the sum of the moments on the inserted package, about the center of the socket, due to two of the plurality of regions, to be substantially greater than zero, and
wherein the combination of forces and moments about the center of the socket of the combination of the four regions results in both the sum of the forces on the inserted package to be approximately zero and the sum of the moments on the inserted package, about the center of the socket, to also be approximately zero.

18. The method of claim 17, wherein the socket further comprises a central region devoid of contacts.

19. The method of claim 17, wherein determining comprises:
   determining a first orientation for a first region and a second orientation for a second region, wherein the second orientation is opposite the first orientation.

20. The method of claim 17, wherein dividing comprises:
   dividing the LGA socket into a first region, a second region, a third region, and a fourth region delimited by a first line bisecting the socket lengthwise and a second line bisecting the socket widthwise, wherein the first region is opposite the second region, and the third region is opposite the fourth region.

21. The method of claim 20, wherein determining comprises:
   determining a first orientation for the first region and the third region; and
   determining a second orientation for the second region and the fourth region, wherein the second orientation is opposite the first orientation.

22. The method of claim 20, wherein determining comprises:
   determining a first orientation for the first region;
   determining a second orientation for the second region, wherein the second orientation is opposite the first orientation;
   determining a third orientation for the third region; and
   determining a fourth orientation for the fourth region, wherein the fourth orientation is opposite the third orientation.

* * * * *